United States Patent
Lei et al.

(10) Patent No.: US 10,714,390 B2
(45) Date of Patent: *Jul. 14, 2020

(54) WAFER DICING USING FEMTOSECOND-BASED LASER AND PLASMA ETCH

(71) Applicant: Applied Materials, Inc., Santa Clara, CA (US)

(72) Inventors: Wei-Sheng Lei, San Jose, CA (US); Brad Eaton, Menlo Park, CA (US); Madhava Rao Yalamanchili, Morgan Hill, CA (US); Saravjeet Singh, Santa Clara, CA (US); Ajay Kumar, Cupertino, CA (US); James M. Holden, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/706,541

(22) Filed: Dec. 6, 2019

(65) Prior Publication Data

US 2020/0118880 A1   Apr. 16, 2020

Related U.S. Application Data

(60) Continuation of application No. 16/193,886, filed on Nov. 16, 2018, now Pat. No. 10,566,238, which is a
(Continued)

(51) Int. Cl.
*H01L 21/00* (2006.01)
*H01L 21/822* (2006.01)
(Continued)

(52) U.S. Cl.
CPC ............ *H01L 21/822* (2013.01); *B23K 26/36* (2013.01); *H01J 37/32889* (2013.01);
(Continued)

(58) Field of Classification Search
CPC .............. H01L 21/822; H01J 37/32889; H01J 37/32899
See application file for complete search history.

(56) References Cited

U.S. PATENT DOCUMENTS

| 4,049,944 | A | 9/1977 | Garvin et al. |
| 4,339,528 | A | 7/1982 | Goldman |

(Continued)

FOREIGN PATENT DOCUMENTS

| CN | 1620713 | 5/2005 |
| CN | 101432853 | 5/2009 |

(Continued)

OTHER PUBLICATIONS

Linder, V. et al., "Water-Soluble Sacrificial Layers for Surface Micromachining," www.small-journal.com, 2005, 1, No. 7, 7 pgs.
(Continued)

*Primary Examiner* — Richard A Booth
(74) *Attorney, Agent, or Firm* — Schwabe, Williamson & Wyatt, P.C.

(57) ABSTRACT

Methods of dicing semiconductor wafers, each wafer having a plurality of integrated circuits, are described. A method includes forming a mask above the semiconductor wafer, the mask including a layer covering and protecting the integrated circuits. The mask and a portion of the semiconductor wafer are patterned with a laser scribing process to provide a patterned mask and to form trenches partially into but not through the semiconductor wafer between the integrated circuits. Each of the trenches has a width. The semiconductor wafer is plasma etched through the trenches to form corresponding trench extensions and to singulate the integrated circuits. Each of the corresponding trench extensions has the width.

10 Claims, 12 Drawing Sheets

Related U.S. Application Data continuation of application No. 15/005,700, filed on Jan. 25, 2016, now Pat. No. 10,163,713, which is a continuation of application No. 14/476,060, filed on Sep. 3, 2014, now Pat. No. 9,245,802, which is a division of application No. 14/146,887, filed on Jan. 3, 2014, now Pat. No. 8,853,056, which is a continuation of application No. 13/160,713, filed on Jun. 15, 2011, now Pat. No. 8,642,448.

(60) Provisional application No. 61/357,468, filed on Jun. 22, 2010.

(51) Int. Cl.

| | |
|---|---|
| H01L 21/3065 | (2006.01) |
| B23K 26/36 | (2014.01) |
| H01L 23/544 | (2006.01) |
| H01L 21/67 | (2006.01) |
| H01J 37/32 | (2006.01) |
| H01L 21/78 | (2006.01) |
| H01L 21/308 | (2006.01) |
| H01L 21/683 | (2006.01) |

(52) U.S. Cl.
CPC .... *H01J 37/32899* (2013.01); *H01L 21/3065* (2013.01); *H01L 21/3083* (2013.01); *H01L 21/67069* (2013.01); *H01L 21/67207* (2013.01); *H01L 21/78* (2013.01); *H01L 23/544* (2013.01); *H01L 21/67092* (2013.01); *H01L 21/6836* (2013.01); *H01L 2221/68327* (2013.01); *H01L 2924/0002* (2013.01)

(56) References Cited

U.S. PATENT DOCUMENTS

| | | | |
|---|---|---|---|
| 4,684,437 | A | 8/1987 | Donelon et al. |
| 5,335,536 | A | 8/1994 | Blischke et al. |
| 5,336,638 | A | 8/1994 | Suzuki et al. |
| 5,593,606 | A | 1/1997 | Owen et al. |
| 5,691,794 | A | 11/1997 | Hoshi et al. |
| 6,051,503 | A | 4/2000 | Bhardwaj et al. |
| 6,057,180 | A | 5/2000 | Sun et al. |
| 6,077,321 | A | 6/2000 | Adachi et al. |
| 6,174,271 | B1 | 1/2001 | Kosmowski |
| 6,300,593 | B1 | 10/2001 | Powell |
| 6,306,731 | B1 | 10/2001 | Igarashi et al. |
| 6,312,525 | B1 | 11/2001 | Bright et al. |
| 6,407,363 | B2 | 6/2002 | Dunsky et al. |
| 6,426,275 | B1 | 7/2002 | Arisa |
| 6,465,158 | B1 | 10/2002 | Sekiya |
| 6,528,864 | B1 | 3/2003 | Arai |
| 6,569,282 | B1 | 5/2003 | Arisa |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,361,990 | B2 | 4/2008 | Lu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,638 | B2 | 3/2009 | Mancini et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,804,043 | B2 | 9/2010 | Deshi |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,926,410 | B2 | 4/2011 | Bair |
| 7,927,973 | B2 | 4/2011 | Haji et al. |
| 8,642,448 | B2 | 2/2014 | Lei et al. |
| 8,853,036 | B2 | 10/2014 | Funayama et al. |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2004/0157457 | A1 | 8/2004 | Xu et al. |
| 2004/0212047 | A1 | 10/2004 | Joshi et al. |
| 2004/0259329 | A1 | 12/2004 | Boyle et al. |
| 2005/0023260 | A1 | 2/2005 | Takyu et al. |
| 2005/0045090 | A1 | 3/2005 | Ikegami et al. |
| 2005/0224181 | A1 | 10/2005 | Merry et al. |
| 2005/0274702 | A1 | 12/2005 | Deshi |
| 2006/0043535 | A1 | 3/2006 | Hiatt |
| 2006/0086898 | A1 | 4/2006 | Cheng et al. |
| 2006/0088984 | A1 | 4/2006 | Li et al. |
| 2006/0146910 | A1 | 7/2006 | Koochesfahani et al. |
| 2006/0205182 | A1 | 9/2006 | Soejima |
| 2007/0272555 | A1 | 11/2007 | Baird |
| 2009/0014052 | A1 | 1/2009 | Borden et al. |
| 2009/0024241 | A1 | 1/2009 | Rice et al. |
| 2009/0239355 | A1 | 9/2009 | Fukaya |
| 2009/0255911 | A1 | 10/2009 | Krishnaswami et al. |
| 2010/0013036 | A1 | 1/2010 | Carey |
| 2010/0025387 | A1 | 2/2010 | Arai et al. |
| 2010/0099238 | A1 | 4/2010 | Vakanas et al. |
| 2010/0129984 | A1 | 5/2010 | Vakanas et al. |
| 2010/0173474 | A1 | 7/2010 | Arita et al. |
| 2010/0216313 | A1 | 8/2010 | Iwai et al. |
| 2010/0248451 | A1 | 9/2010 | Pirogovsky et al. |
| 2011/0014777 | A1 | 1/2011 | Haji et al. |
| 2011/0312157 | A1 | 12/2011 | Lei et al. |
| 2012/0322239 | A1 | 12/2012 | Singh et al. |
| 2013/0045554 | A1 | 2/2013 | Yamazaki |
| 2013/0065378 | A1 | 3/2013 | Johnson et al. |
| 2013/0230972 | A1 | 9/2013 | Johnson et al. |
| 2016/0307851 | A1 | 10/2016 | Ohura et al. |

FOREIGN PATENT DOCUMENTS

| | | |
|---|---|---|
| CN | 101542714 | 9/2009 |
| JP | 9216085 | 8/1997 |
| JP | 10321908 | 12/1998 |
| JP | 2001127011 | 5/2001 |
| JP | 2001144126 | 5/2001 |
| JP | 2001148358 | 5/2001 |
| JP | 2003179005 | 6/2003 |
| JP | 2004031528 | 1/2004 |
| JP | 2004055684 | 2/2004 |
| JP | 2005074485 | 3/2005 |
| JP | 2006135289 | 5/2006 |
| JP | 2006253402 | 9/2006 |
| JP | 2006310349 | 11/2006 |
| JP | 2007533139 | 11/2007 |
| JP | 2008193034 | 8/2008 |
| JP | 2008244356 | 10/2008 |
| JP | 2009117718 | 5/2009 |
| JP | 2009231632 | 10/2009 |
| JP | 2009538233 | 11/2009 |
| JP | 2010165963 | 7/2010 |
| JP | 2011-517368 | 6/2011 |
| JP | 2011-517622 | 6/2011 |

(56) References Cited

FOREIGN PATENT DOCUMENTS

| KR | 10-20060099435 | 9/2006 |
|---|---|---|
| KR | 10-20090026137 | 3/2009 |
| KR | 10-20090115039 | 11/2009 |
| TW | 1224370 | 11/2004 |
| TW | 200618095 | 6/2006 |
| TW | 200719431 | 5/2007 |
| TW | 200736844 | 10/2007 |
| TW | 200834698 | 8/2008 |
| TW | 200834702 | 8/2008 |
| TW | 200848190 | 12/2008 |
| WO | WO 03036712 | 5/2003 |
| WO | WO 03071591 | 5/2003 |
| WO | WO 2005101100 | 10/2005 |
| WO | WO 2006055984 | 5/2006 |
| WO | WO 2009111344 | 9/2009 |
| WO | WO 2009117451 | 9/2009 |
| WO | WO 2010080983 | 7/2010 |

OTHER PUBLICATIONS

Singh, Saravjeet, et al., "Apparatus and Methods for Dry Etch With Edge, Side and Back Protection," U.S. Appl. No. 61/491,693, filed May 31, 2011 24 pgs.
International Search Report and Written Opinion form PCT/US2011/041126 dated Feb. 21, 2012, 10 pgs.
International Preliminary Report on Patentability from PCT/US2011/041126 dated Jan. 10, 2013, 7 pgs.
Non-Final Office Action from U.S. Appl. No. 13/160,713 dated Jun. 6, 2013, 12 pgs.
Non-Final Office Action from U.S. Appl. No. 14/476,060 dated Apr. 9, 2015, 7 pgs.
Non-Final Office Action from U.S. Appl. No. 14/146,887 dated Feb. 18, 2014, 6 pgs.
Office Action for Chinese Patent Application No. 201180021218.X, dated Mar. 17, 2015, 20 pgs.
Office Action for Japanese Patent Application No. 2014221016, dated Oct. 20, 2015, 8 pgs.
Office Action for Japanese Patent Application No. 2014257046, dated Apr. 5, 2016, 5 pgs.
Office Action for Japanese Patent Application No. 2014-221016 dated Sep. 20, 2016, 6 pgs.
Final Office Action for Japanese Patent Application No. 2014257046 dated Jan. 24, 2017, 4 pgs., with English translation.
First Office Action from Japanese Patent Application No. 2017-092862 dated Dec. 12, 2017, 4 pgs., with English translation.
Office Action for Korean Patent Application No. 10-20127028305, dated Oct. 7, 2014, 19 pgs.
Office Action and Search Report for Taiwanese Patent Application No. 100121661 dated Jul. 9, 2014, 5 pgs.
Office Action for Taiwanese Patent Application No. 100121661, dated Aug. 26, 2014, 5 pgs,.
Office Action for Taiwanese Patent Application No. 103116415, dated Aug. 7, 2015, 9 pgs.
Office Action for Taiwanese Patent Application No. 103116415, dated Aug. 10, 2015, 5 pgs,.
Notice of First Office Action from Chinese Patent Application No. 201510982784.7 dated Sep. 11, 2017, 8 pgs.
Notice of Third Office Action from Chinese Patent Application No. 201510982784.7 dated Oct. 8, 2018, 10 pgs.
Notice of Decision of Refusal from the Korean Intellectual Property Office for Korean Patent Application No. 10-2014-7033266, dated Apr. 23, 2018, 6 pgs.
Chinese Office Action with English Translation of the Search Report from Chinese Divisional Patent Application No. 201510982784.7 dated Apr. 16, 2018, 9 pgs.
Office Action from Korean Patent Application No. 10-2014-7016661, dated Mar. 26, 2018, 12 pgs.
Notice of Reasons for Rejection from Japanese Patent Application No. 2014-257046, Appeal No. 2017-006593 dated Jul. 3, 2018, 10 pgs.
Non-Final Office Action from U.S. Appl. No. 16/193,886 dated Feb. 7, 2019, 14 pgs.
Appeal Decision of Rejection for Japanese Application No. 2014-221016, issued Feb. 22, 2019, 11 pgs.
Notice of Office Action for Korean Patent Divisional Application No. 10-2019-7000628, dated Feb. 8, 2019, 9 pgs.
Final Office Action from U.S. Appl. No. 16/193,886 dated May 30, 2019, 12 pgs.
Office Action from Japanese Patent Application No. 2017-092862 dated Jun. 11, 2019, 8 pgs.
Notice of Office Action from Korea Application No. 10-2019-7000626, dated Jul. 11, 2019, 2 pgs.
Notice of Office Action from Korean Patent Application No. 10-2019-7026664 dated Nov. 20, 2019, 7 pgs.

$$I = \frac{E_p}{\pi \cdot w_0^2 \cdot \tau}$$

Where $I$ is Intensity, $E_p$ is Pulse Energy, $w_0$ is Beam Radius, and $\tau$ is Pulse Width.

WAFER DICING USING FEMTOSECOND-BASED LASER AND PLASMA ETCH

CROSS-REFERENCE TO RELATED APPLICATIONS

This application is a continuation of U.S. patent application Ser. No. 16/193,886, filed Nov. 16, 2018, which is a continuation of U.S. patent application Ser. No. 15/005,700, filed Jan. 25, 2016, now U.S. Pat. No. 10,163,713, issued Dec. 25, 2018, which is a continuation of U.S. patent application Ser. No. 14/476,060, filed Sep. 3, 2014, now U.S. Pat. No. 9,245,802, issued Jan. 26, 2016, which is a divisional of U.S. patent application Ser. No. 14/146,887, filed Jan. 3, 2014, now U.S. Pat. No. 8,853,056, issued Oct. 7, 2014, which is a continuation of U.S. patent application Ser. No. 13/160,713, filed Jun. 15, 2011, now U.S. Pat. No. 8,642,448, issued Feb. 4, 2014, which claims the benefit of U.S. Provisional Application No. 61/357,468, filed Jun. 22, 2010, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits includes forming a mask above the semiconductor wafer, the mask composed of a layer covering and protecting the integrated circuits. The mask is then patterned with a femtosecond-based laser scribing process to provide a patterned mask with gaps, exposing regions of the semiconductor wafer between the integrated circuits. The semiconductor wafer is then etched through the gaps in the patterned mask to singulate the integrated circuits.

In another embodiment, a system for dicing a semiconductor wafer includes a factory interface. A laser scribe apparatus is coupled with the factory interface and includes a femtosecond-based laser. A plasma etch chamber is also coupled with the factory interface.

In another embodiment, a method of dicing a semiconductor wafer having a plurality of integrated circuits includes forming a polymer layer above a silicon substrate. The polymer layer covers and protects integrated circuits disposed on the silicon substrate. The integrated circuits are composed of a layer of silicon dioxide disposed above a layer of low K material and a layer of copper. The polymer layer, the layer of silicon dioxide, the layer of low K material, and the layer of copper are patterned with a femtosecond-based laser scribing process to expose regions of the silicon substrate between the integrated circuits. The silicon substrate is then etched through the gaps to singulate the integrated circuits.

DETAILED DESCRIPTION

Figure 1:
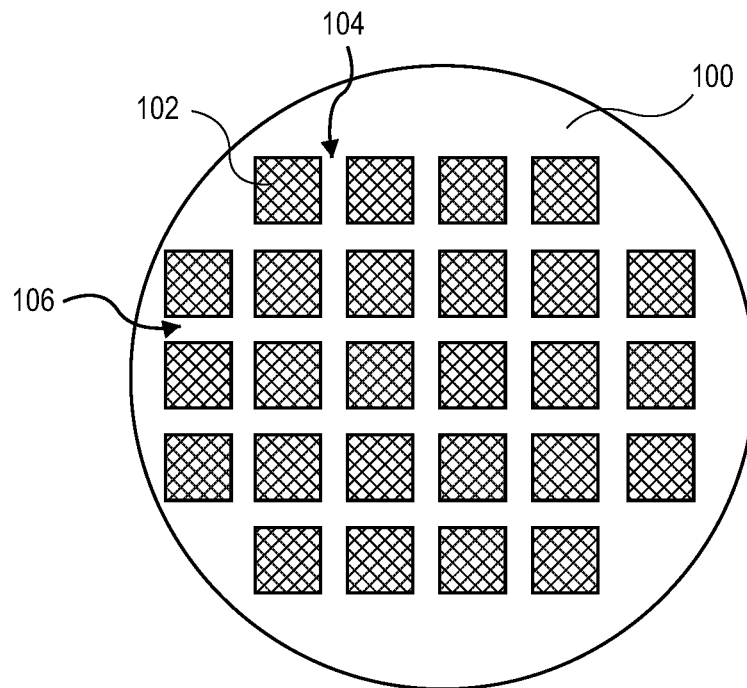
FIG. 1 illustrates a top plan of a semiconductor wafer to be diced, in accordance with an embodiment of the present invention.

Methods of dicing semiconductor wafers, each wafer having a plurality of integrated circuits thereon, are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

Conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of femtosecond-based laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
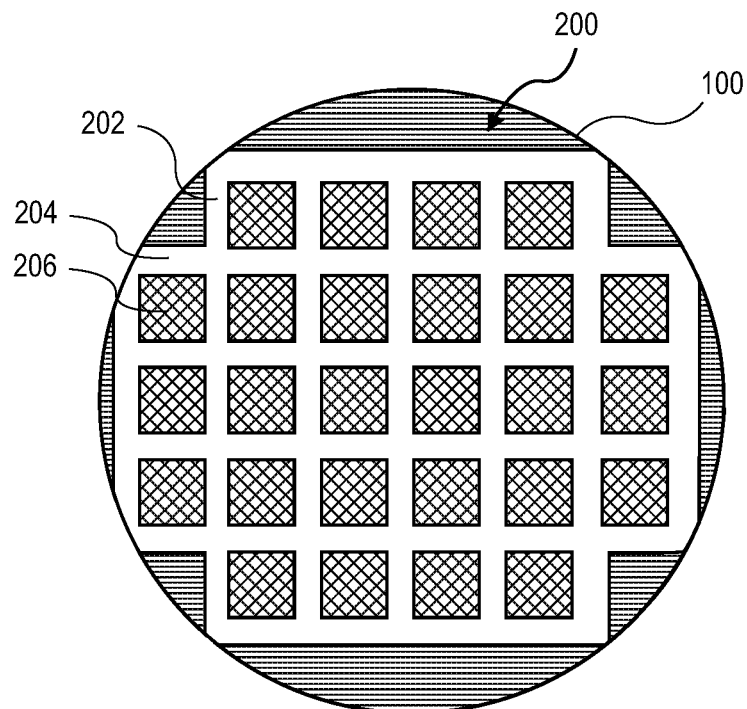
FIG. 2 illustrates a top plan of a semiconductor wafer to be diced that has a dicing mask formed thereon, in accordance with an embodiment of the present invention.

Thus, in an aspect of the present invention, a combination of femtosecond-based laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination femtosecond-based laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100.

Figure 3:
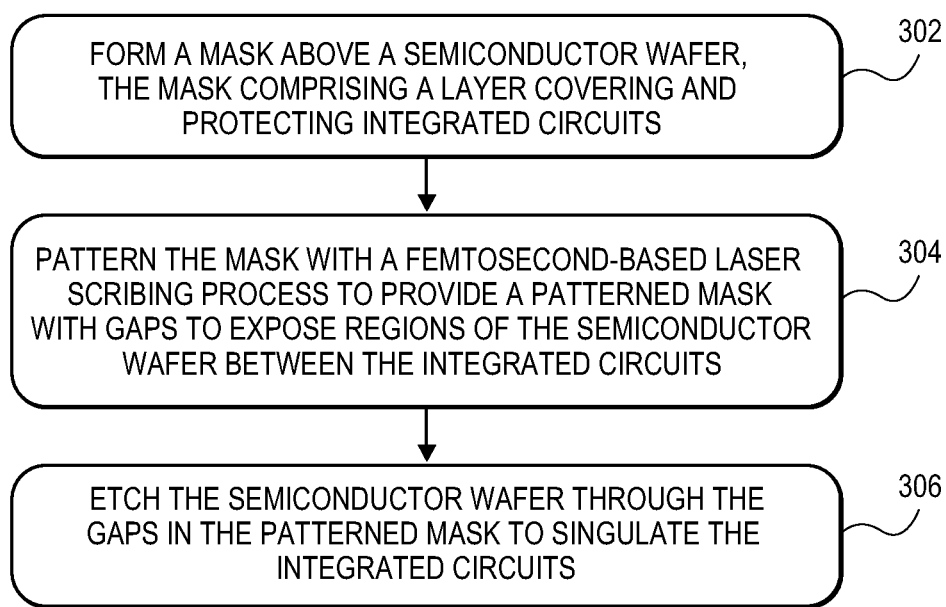
FIG. 3 is a Flowchart representing operations in a method of dicing a semiconductor wafer including a plurality of integrated circuits, in accordance with an embodiment of the present invention.
Figure 4A:
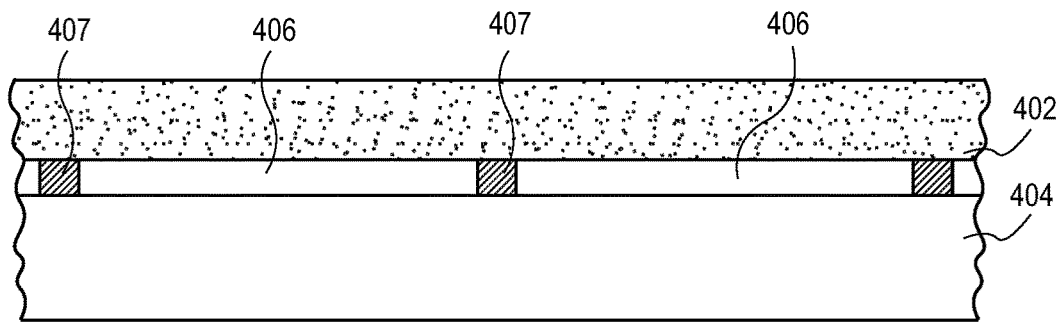
FIG. 4A illustrates a cross-sectional view of a semiconductor wafer including a plurality of integrated circuits during performing of a method of dicing the semiconductor wafer, corresponding to operation 302 of the Flowchart of FIG. 3, in accordance with an embodiment of the present invention.
Figure 4B:
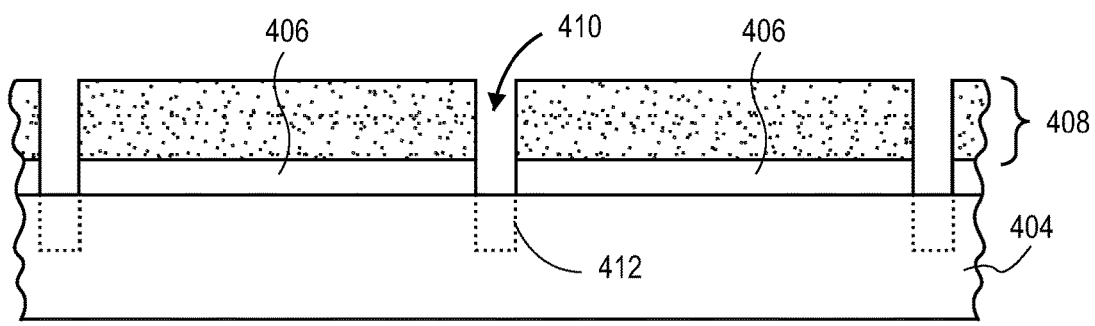
FIG. 4B illustrates a cross-sectional view of a semiconductor wafer including a plurality of integrated circuits during performing of a method of dicing the semiconductor wafer, corresponding to operation 304 of the Flowchart of FIG. 3, in accordance with an embodiment of the present invention.
Figure 4C:
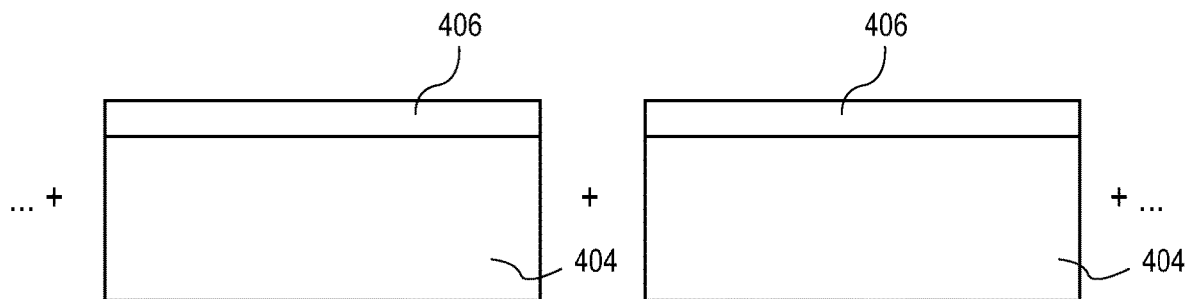
FIG. 4C illustrates a cross-sectional view of a semiconductor wafer including a plurality of integrated circuits during performing of a method of dicing the semiconductor wafer, corresponding to operation 306 of the Flowchart of FIG. 3, in accordance with an embodiment of the present invention.

FIG. 3 is a Flowchart 300 representing operations in a method of dicing a semiconductor wafer including a plurality of integrated circuits, in accordance with an embodiment of the present invention. FIGS. 4A-4C illustrate cross-sectional views of a semiconductor wafer including a plurality of integrated circuits during performing of a method of dicing the semiconductor wafer, corresponding to operations of Flowchart 300, in accordance with an embodiment of the present invention.

Referring to operation 302 of Flowchart 300, and corresponding FIG. 4A, a mask 402 is formed above a semiconductor wafer or substrate 404. The mask 402 is composed of a layer covering and protecting integrated circuits 406 formed on the surface of semiconductor wafer 404. The mask 402 also covers intervening streets 407 formed between each of the integrated circuits 406.

In accordance with an embodiment of the present invention, forming the mask 402 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In an embodiment, semiconductor wafer or substrate 404 is composed of a material suitable to withstand a fabrication process and upon which semiconductor processing layers may suitably be disposed. For example, in one embodiment, semiconductor wafer or substrate 404 is composed of a group IV-based material such as, but not limited to, crystalline silicon, germanium or silicon/germanium. In a specific embodiment, providing semiconductor wafer 404 includes providing a monocrystalline silicon substrate. In a particular embodiment, the monocrystalline silicon substrate is doped with impurity atoms. In another embodiment, semiconductor wafer or substrate 404 is composed of a III-V material such as, e.g., a III-V material substrate used in the fabrication of light emitting diodes (LEDs).

In an embodiment, semiconductor wafer or substrate 404 has disposed thereon or therein, as a portion of the integrated circuits 406, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 406. Materials making up the streets 407 may be similar to or the same as those materials used to form the integrated circuits 406. For example, streets 407 may be composed of layers of dielectric materials, semiconductor materials, and metallization. In one embodiment, one or more of the streets 407 includes test devices similar to the actual devices of the integrated circuits 406.

Referring to operation 304 of Flowchart 300, and corresponding FIG. 4B, the mask 402 is patterned with a femtosecond-based laser scribing process to provide a patterned mask 408 with gaps 410, exposing regions of the semiconductor wafer or substrate 404 between the integrated circuits 406. As such, the femtosecond-based laser scribing process is used to remove the material of the streets 407 originally formed between the integrated circuits 406. In accordance with an embodiment of the present invention, patterning the mask 402 with the femtosecond-based laser scribing process includes forming trenches 412 partially into the regions of the semiconductor wafer 404 between the integrated circuits 406, as depicted in FIG. 4B.

In an embodiment, patterning the mask 406 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 402, the streets 407 and, possibly, a portion of the semiconductor wafer or substrate 404.

Figure 5:
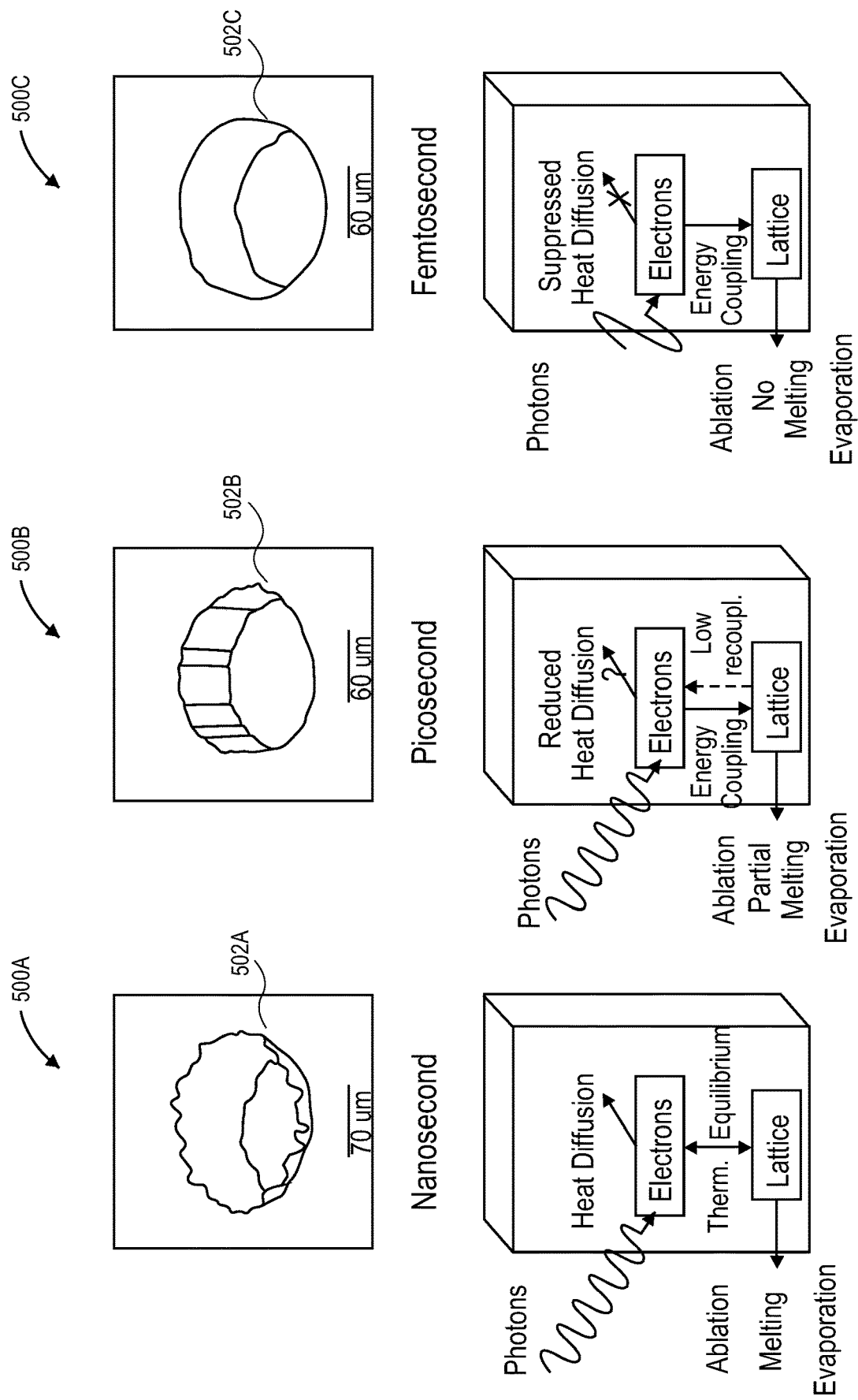
FIG. 5 illustrates the effects of using a laser pulse in the femtosecond range versus longer pulse times, in accordance with an embodiment of the present invention.

FIG. 5 illustrates the effects of using a laser pulse in the femtosecond range versus longer frequencies, in accordance with an embodiment of the present invention. Referring to FIG. 5, by using a laser with a pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Figure 6:
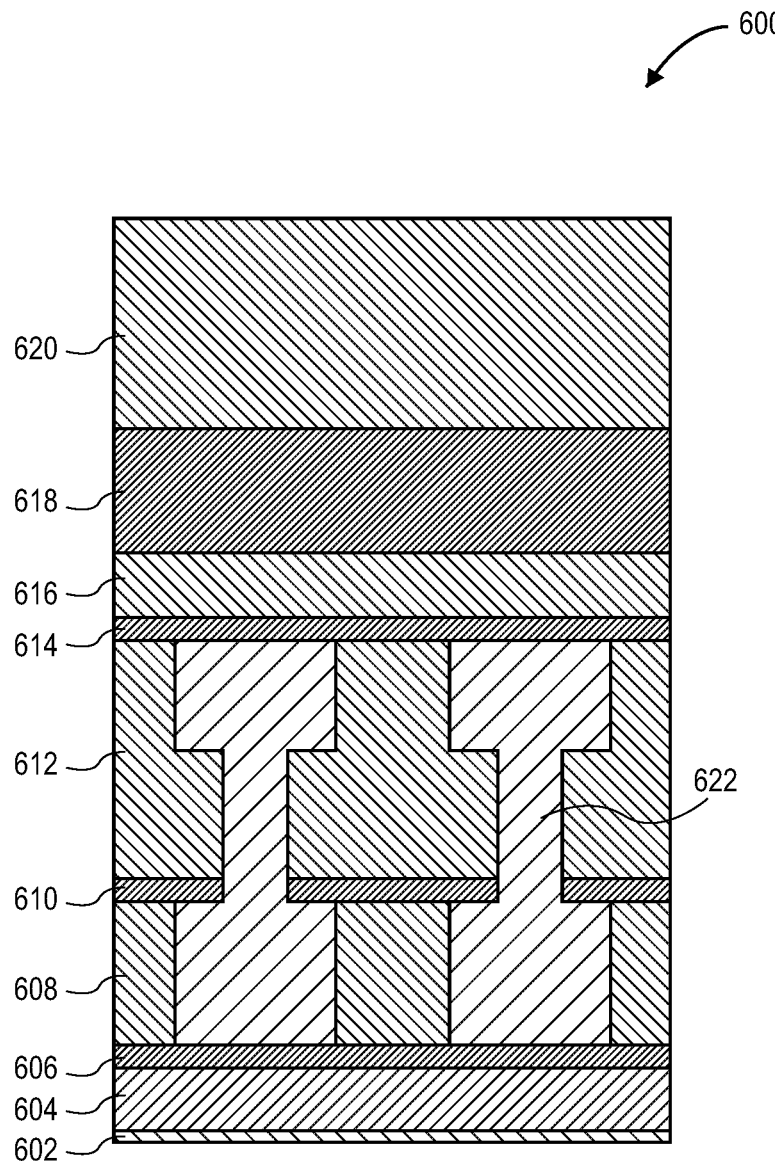
FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, and a layer of photoresist 620, with relative thicknesses depicted. Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Figures 7, 8:
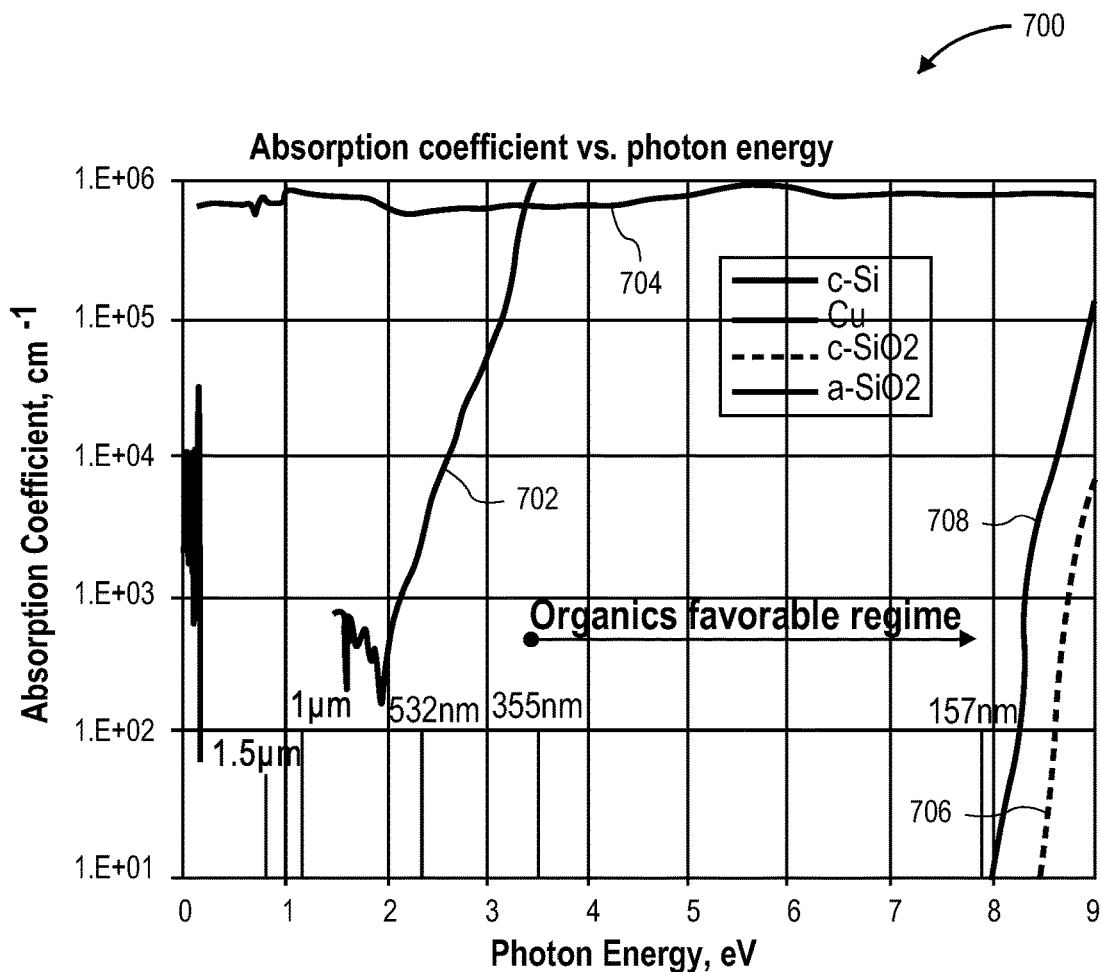
FIG. 7 includes a plot of absorption coefficient as a function of photon energy for crystalline silicon (c-Si), copper (Cu), crystalline silicon dioxide (c-$SiO_2$), and amorphous silicon dioxide (a-$SiO_2$), in accordance with an embodiment of the present invention.
FIG. 8 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 7 includes a plot 700 of absorption coefficient as a function of photon energy for crystalline silicon (c-Si, 702), copper (Cu, 704), crystalline silicon dioxide (c-$SiO_2$, 706), and amorphous silicon dioxide (a-$SiO_2$, 708), in accordance with an embodiment of the present invention. FIG. 8 is an equation 800 showing the relationship of laser intensity for a given laser as a function of laser pulse energy, laser pulse width, and laser beam radius.

Using equation 800 and the plot 700 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a mask, a street, and a portion of a silicon substrate.

By contrast, if non-optimal laser parameters are selected, in a stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 306 of Flowchart 300, and corresponding FIG. 4C, the semiconductor wafer 404 is etched through the gaps 410 in the patterned mask 408 to singulate the integrated circuits 406. In accordance with an embodiment of the present invention, etching the semiconductor wafer 404 includes etching the trenches 412 formed with the femtosecond-based laser scribing process to ultimately etch entirely through semiconductor wafer 404, as depicted in FIG. 4C.

In an embodiment, etching the semiconductor wafer 404 includes using a plasma etching process. In one embodiment, a through-silicon via type etch process is used. For example, in a specific embodiment, the etch rate of the material of semiconductor wafer 404 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the mask layer 408 is removed after the singulation process, as depicted in FIG. 4C.

Accordingly, referring again to Flowchart 300 and FIGS. 4A-4C, wafer dicing may be preformed by initial laser ablation through a mask layer, through wafer streets (including metallization), and partially into a silicon substrate. The laser pulse width may be selected in the femtosecond range. Die singulation may then be completed by subsequent through-silicon deep plasma etching. A specific example of a materials stack for dicing is described below in association with FIGS. 9A-9D, in accordance with an embodiment of the present invention.

Figure 9A:
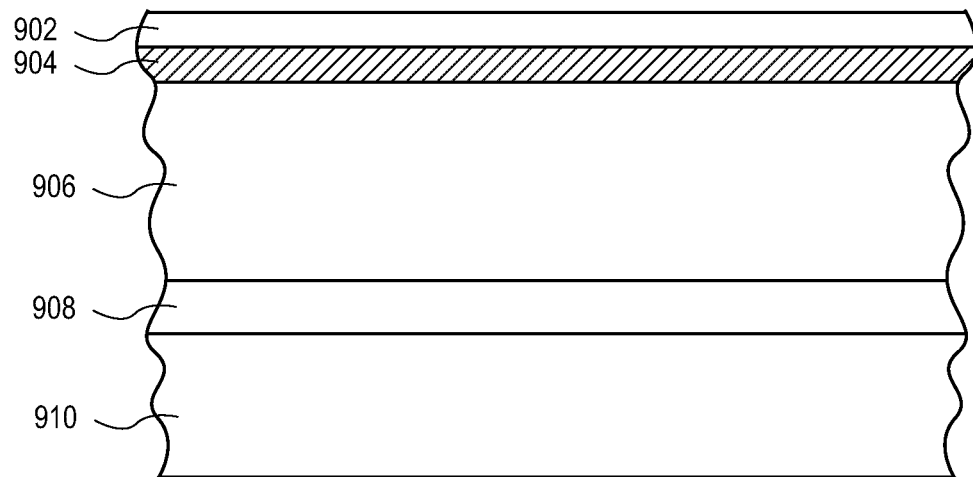
FIGS. 9A-9D illustrate cross-sectional views of various operations in a method of dicing a semiconductor wafer, in accordance with an embodiment of the present invention.

Referring to FIG. 9A, a materials stack for hybrid laser ablation and plasma etch dicing includes a mask layer 902, a device layer 904, and a substrate 906. The mask layer, device layer, and substrate are disposed above a die attach film 908 which is affixed to a backing tape 910. In an embodiment, the mask layer 902 is a photo-resist layer such as the photo-resist layers described above in association with mask 402. The device layer 904 includes an inorganic dielectric layer (such as silicon dioxide) disposed above one or more metal layers (such as copper layers) and one or more low K dielectric layers (such as carbon-doped oxide layers). The device layer 904 also includes streets arranged between integrated circuits, the streets including the same or similar layers to the integrated circuits. The substrate 906 is a bulk single-crystalline silicon substrate.

In an embodiment, the bulk single-crystalline silicon substrate 906 is thinned from the backside prior to being affixed to the die attach film 908. The thinning may be performed by a backside grind process. In one embodiment, the bulk single-crystalline silicon substrate 906 is thinned to a thickness approximately in the range of 50-100 microns. It is important to note that, in an embodiment, the thinning is performed prior to a laser ablation and plasma etch dicing process. In an embodiment, the photo-resist layer 902 has a thickness of approximately 5 microns and the device layer 904 has a thickness approximately in the range of 2-3 microns. In an embodiment, the die attach film 908 (or any suitable substitute capable of bonding a thinned or thin wafer or substrate to the backing tape 910) has a thickness of approximately 20 microns.

Figure 9B:
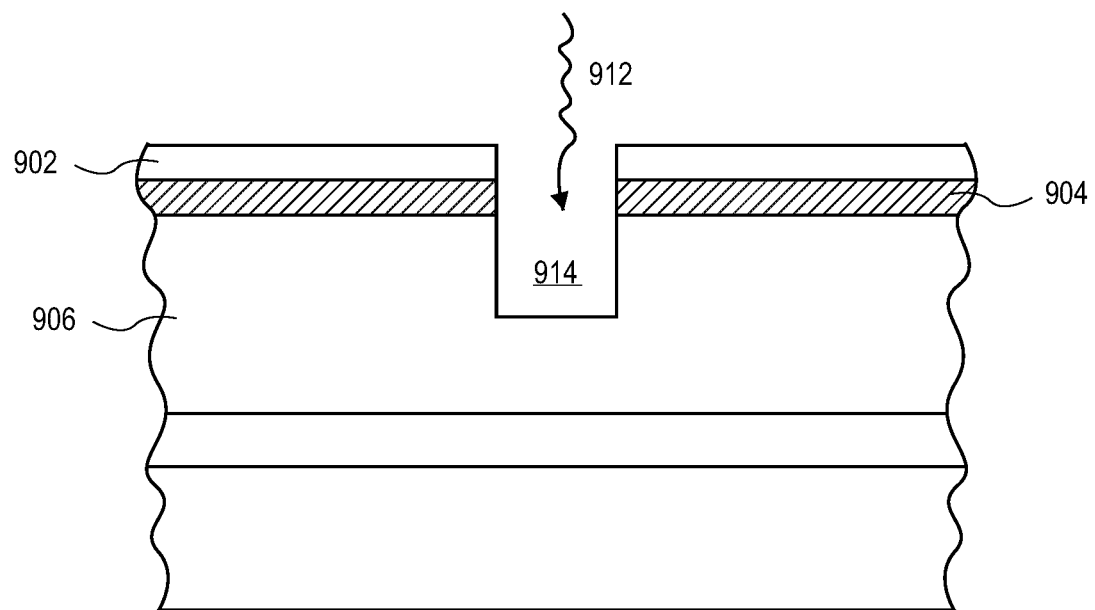
Figure 9C:
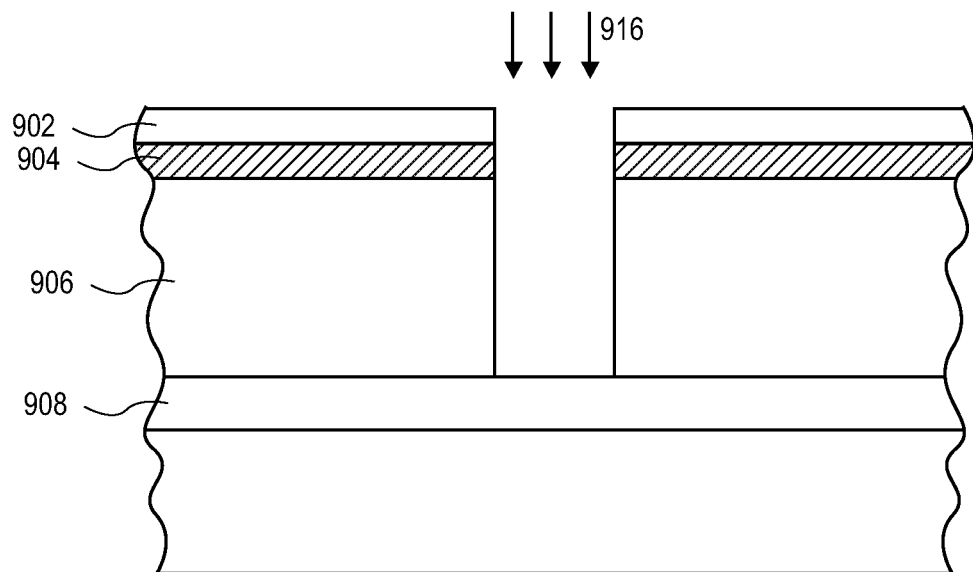

Referring to FIG. 9B, the mask 902, the device layer 904 and a portion of the substrate 906 are patterned with a femtosecond-based laser scribing process 912 to form trenches 914 in the substrate 906. Referring to FIG. 9C, a through-silicon deep plasma etch process 916 is used to extend the trench 914 down to the die attach film 908, exposing the top portion of the die attach film 908 and singulating the silicon substrate 906. The device layer 904 is protected by the photo-resist layer 902 during the through-silicon deep plasma etch process 916.

Figure 9D:
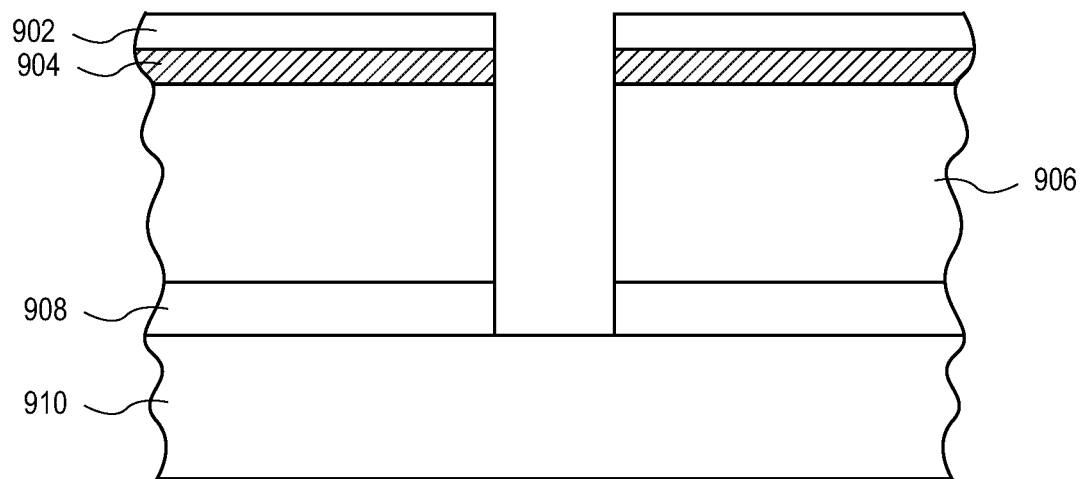

Referring to FIG. 9D, the singulation process may further include patterning the die attach film 908, exposing the top portion of the backing tape 910 and singulating the die attach film 908. In an embodiment, the die attach film is singulated by a laser process or by an etch process. Further embodiments may include subsequently removing the singulated portions of substrate 906 (e.g., as individual integrated circuits) from the backing tape 910. In one embodiment, the singulated die attach film 908 is retained on the back sides of the singulated portions of substrate 906. Other embodiments may include removing the masking photo-resist layer 902 from the device layer 904. In an alternative embodiment, in the case that substrate 906 is thinner than approximately 50 microns, the laser ablation process 912 is used to completely singulate substrate 906 without the use of an additional plasma process.

Subsequent to singulating the die attach film 908, in an embodiment, the masking photo-resist layer 902 is removed from the device layer 904. In an embodiment, the singulated integrated circuits are removed from the backing tape 910 for packaging. In one such embodiment, the patterned die attach film 908 is retained on the backside of each integrated circuit and included in the final packaging. However, in another embodiment, the patterned die attach film 908 is removed during or subsequent to the singulation process.

Referring again to FIGS. 4A-4C, the plurality of integrated circuits 406 may be separated by streets 407 having a width of approximately 10 microns or smaller. The use of a femtosecond-based laser scribing approach, at least in part due to the tight profile control of the laser, may enable such compaction in a layout of integrated circuits. For example, FIG. 10 illustrates compaction on a semiconductor wafer or substrate achieved by using narrower streets versus conventional dicing which may be limited to a minimum width, in accordance with an embodiment of the present invention.

Figure 10:
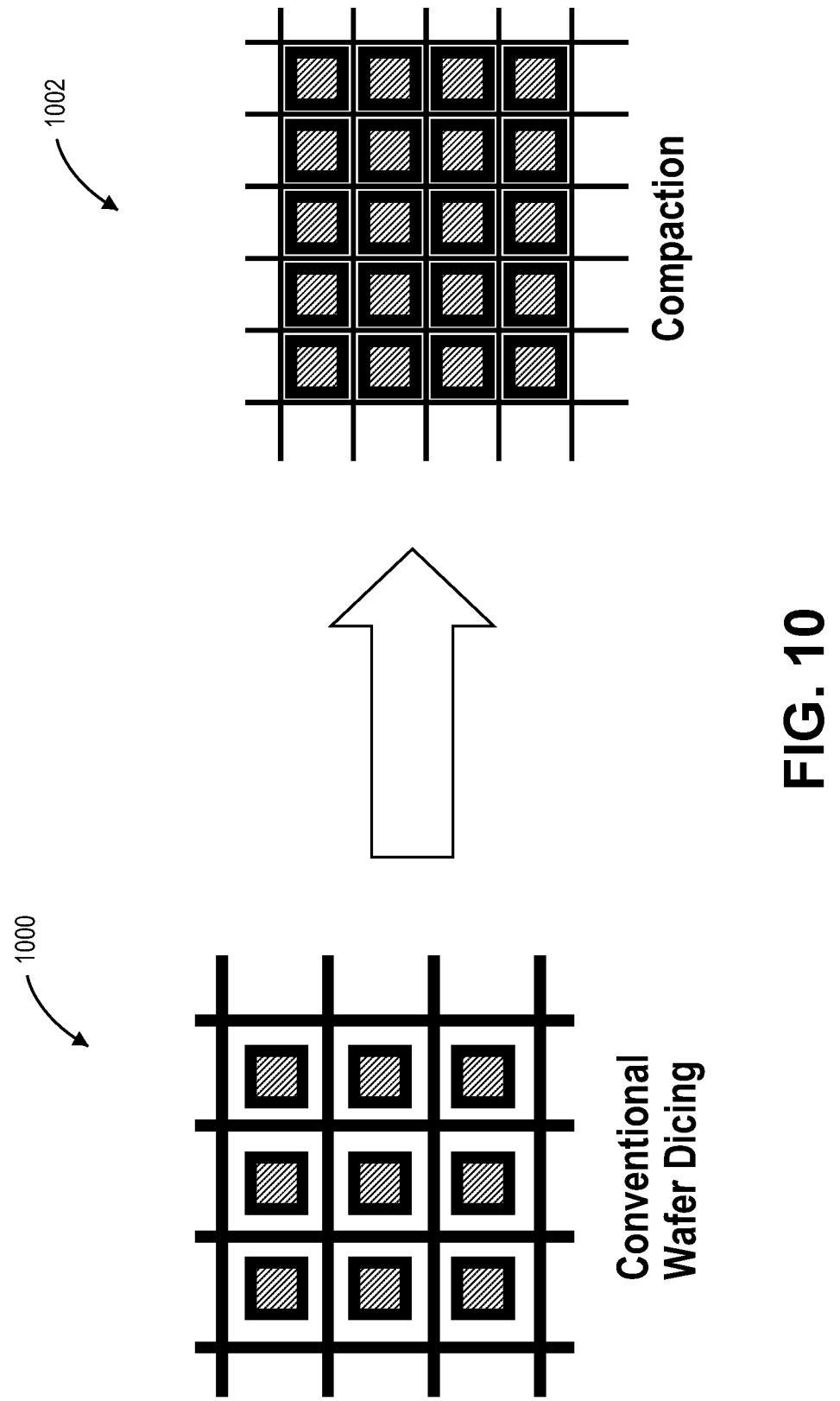
FIG. 10 illustrates compaction on a semiconductor wafer achieved by using narrower streets versus conventional dicing which may be limited to a minimum width, in accordance with an embodiment of the present invention.

Referring to FIG. 10, compaction on a semiconductor wafer is achieved by using narrower streets (e.g., widths of approximately 10 microns or smaller in layout 1002) versus conventional dicing which may be limited to a minimum width (e.g., widths of approximately 70 microns or larger in layout 1000). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 11:
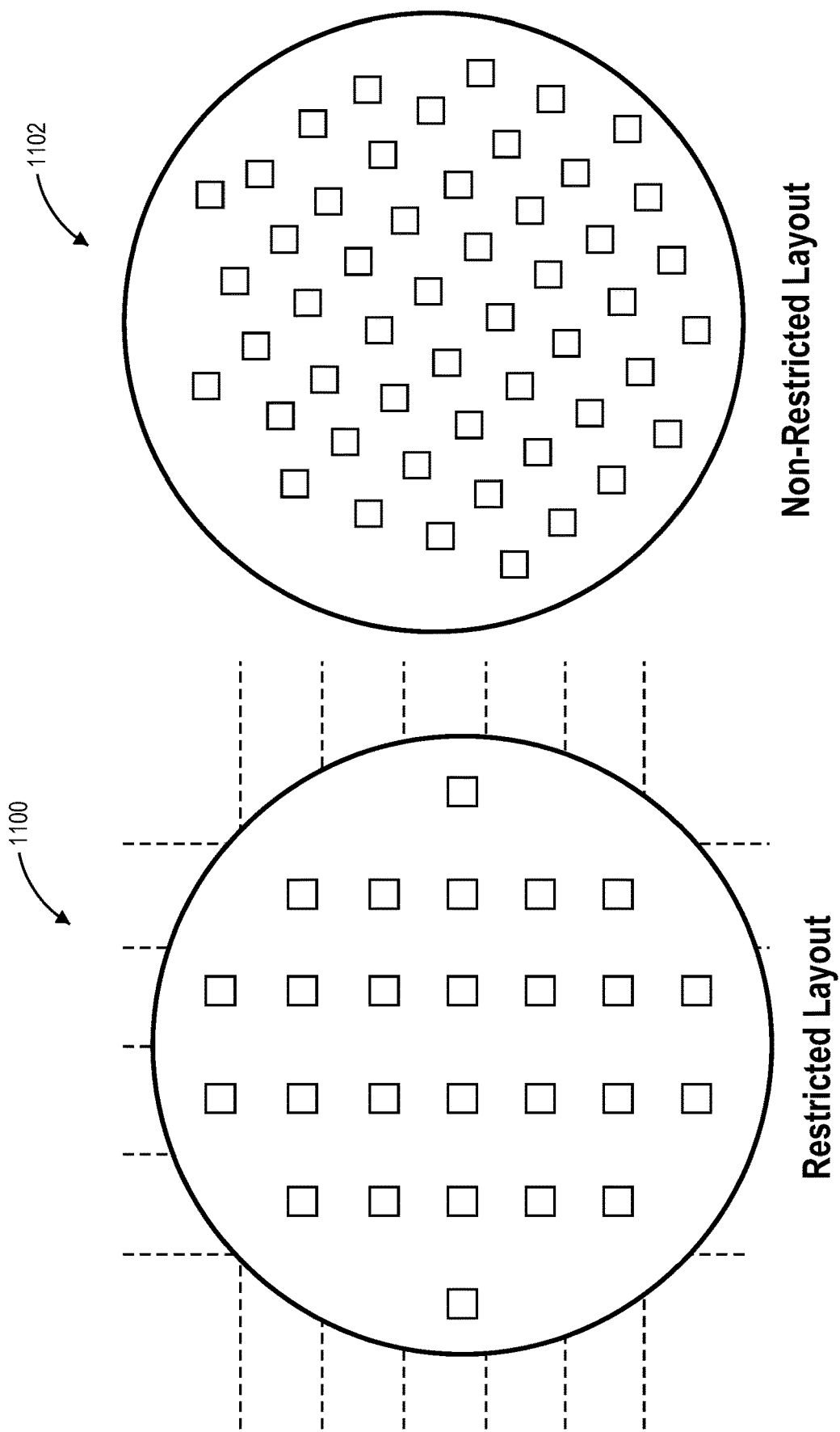
FIG. 11 illustrates freeform integrated circuit arrangement allowing denser packing and, hence, more die per wafer versus grid alignment approaches, in accordance with an embodiment of the present invention.

Referring again to FIGS. 4A-4C, the plurality of integrated circuits 406 may be arranged on semiconductor wafer or substrate 404 in a non-restricted layout. For example, FIG. 11 illustrates freeform integrated circuit arrangement allowing denser packing. The denser packing may provide for more die per wafer versus grid alignment approaches, in accordance with an embodiment of the present invention. Referring to FIG. 11, a freeform layout (e.g., a non-restricted layout on semiconductor wafer or substrate 1102) allows denser packing and hence more die per wafer versus grid alignment approaches (e.g., a restricted layout on semiconductor wafer or substrate 1100). In an embodiment, the speed of the laser ablation and plasma etch singulation process is independent of die size, layout or the number of streets.

A single process tool may be configured to perform many or all of the operations in a hybrid femtosecond-based laser ablation and plasma etch singulation process. For example, FIG. 12 illustrates a block diagram of a tool layout for laser and plasma dicing of wafers or substrates, in accordance with an embodiment of the present invention.

Figure 12:
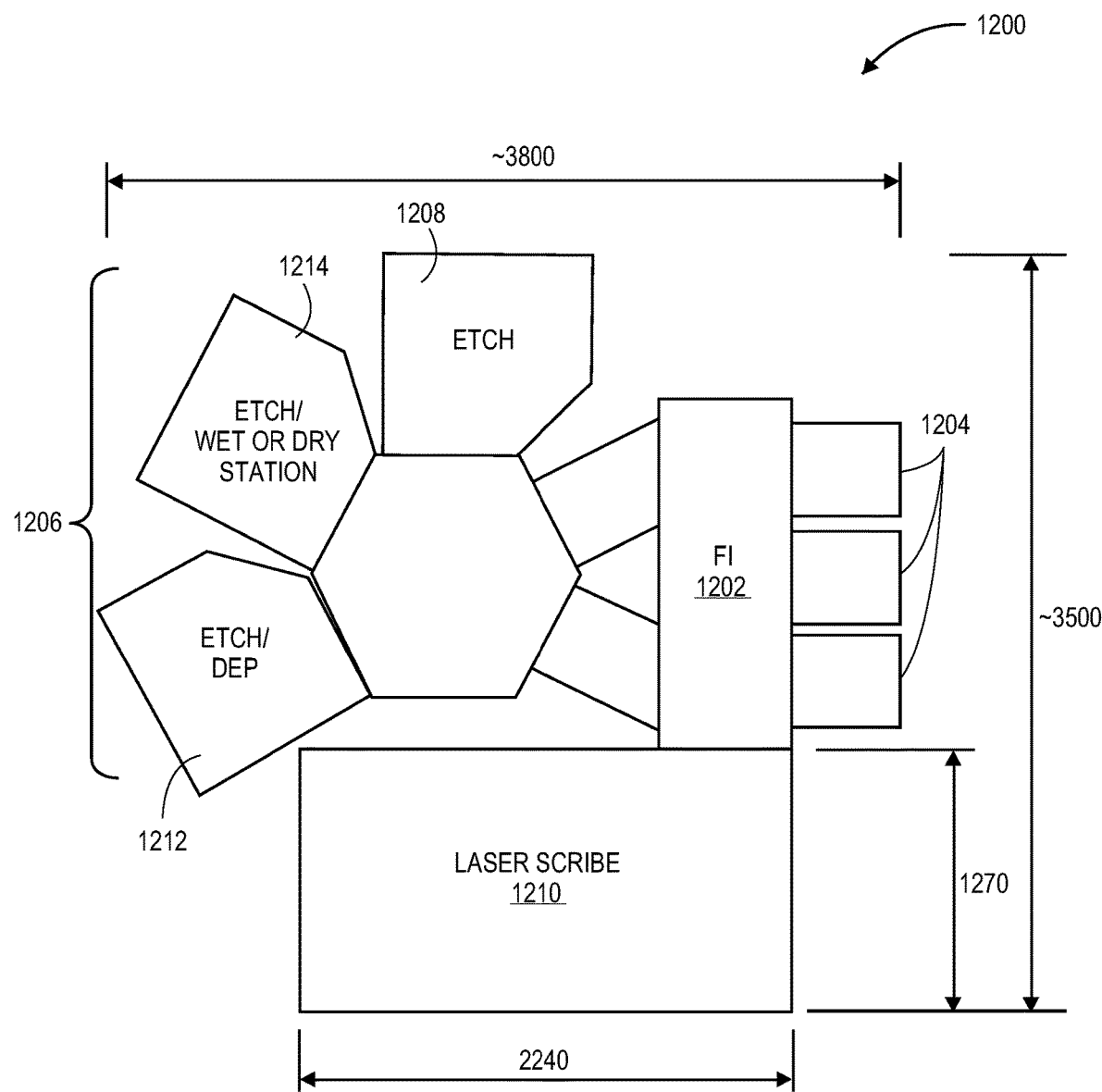
FIG. 12 illustrates a block diagram of a tool layout for laser and plasma dicing of wafers or substrates, in accordance with an embodiment of the present invention.

Referring to FIG. 12, a process tool 1200 includes a factory interface 1202 (FI) having a plurality of load locks 1204 coupled therewith. A cluster tool 1206 is coupled with the factory interface 1202. The cluster tool 1206 includes one or more plasma etch chambers, such as plasma etch chamber 1208. A laser scribe apparatus 1210 is also coupled to the factory interface 1202. The overall footprint of the process tool 1200 may be, in one embodiment, approximately 3500 millimeters (3.5 meters) by approximately 3800 millimeters (3.8 meters), as depicted in FIG. 12.

In an embodiment, the laser scribe apparatus 1210 houses a femtosecond-based laser. The femtosecond-based laser is suitable for performing a laser ablation portion of a hybrid laser and etch singulation process, such as the laser abalation processes described above. In one embodiment, a moveable stage is also included in laser scribe apparatus 1200, the moveable stage configured for moving a wafer or substrate (or a carrier thereof) relative to the femtosecond-based laser. In a specific embodiment, the femtosecond-based laser is also moveable. The overall footprint of the laser scribe apparatus 1210 may be, in one embodiment, approximately 2240 millimeters by approximately 1270 millimeters, as depicted in FIG. 12.

In an embodiment, the one or more plasma etch chambers 1208 is configured for etching a wafer or substrate through the gaps in a patterned mask to singulate a plurality of integrated circuits. In one such embodiment, the one or more plasma etch chambers 1208 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1208 to facilitate high silicon etch rates. In an embodiment, more than one etch chamber is included in the cluster tool 1206 portion of process tool 1200 to enable high manufacturing throughput of the singulation or dicing process.

The factory interface 1202 may be a suitable atmospheric port to interface between an outside manufacturing facility with laser scribe apparatus 1210 and cluster tool 1206. The factory interface 1202 may include robots with arms or blades for transferring wafers (or carriers thereof) from storage units (such as front opening unified pods) into either cluster tool 1206 or laser scribe apparatus 1210, or both.

Cluster tool 1206 may include other chambers suitable for performing functions in a method of singulation. For example, in one embodiment, in place of an additional etch chamber, a deposition chamber 1212 is included. The deposition chamber 1212 may be configured for mask deposition on or above a device layer of a wafer or substrate prior to laser scribing of the wafer or substrate. In one such embodiment, the deposition chamber 1212 is suitable for depositing a photo-resist layer. In another embodiment, in place of an additional etch chamber, a wet/dry station 1214 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 1200.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 12. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 13:
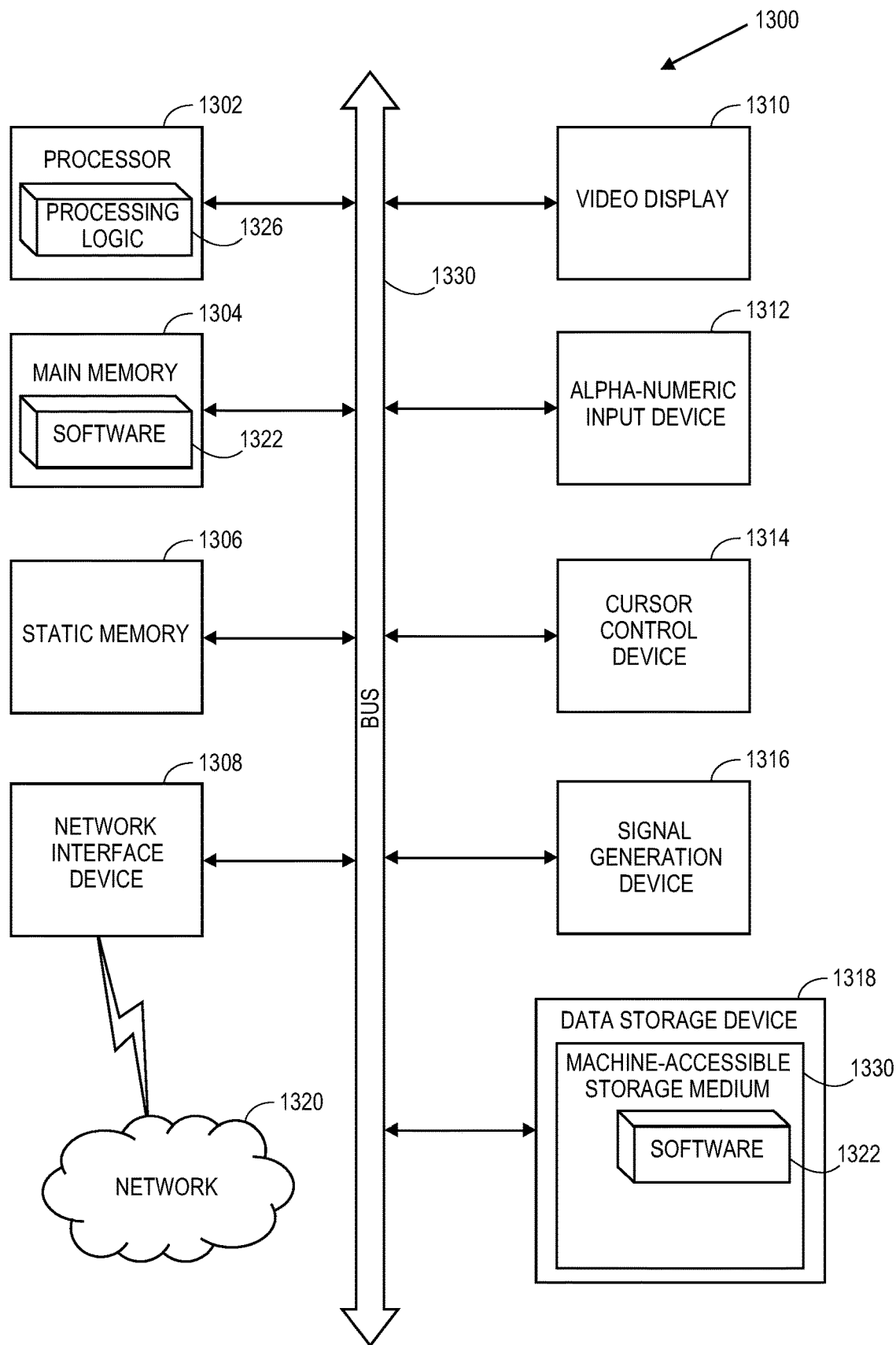
FIG. 13 illustrates a block diagram of an exemplary computer system, in accordance with an embodiment of the present invention.

FIG. 13 illustrates a diagrammatic representation of a machine in the exemplary form of a computer system 1300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations described herein.

The computer system 1300 may further include a network interface device 1308. The computer system 1300 also may include a video display unit 1310 (e.g., a liquid crystal display (LCD), a light emitting diode display (LED), or a cathode ray tube (CRT)), an alphanumeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1331 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

While the machine-accessible storage medium 1331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with a femtosecond-based laser scribing process to provide a patterned mask with gaps. Regions of the semiconductor wafer are exposed between the integrated circuits. The semiconductor wafer is then etched through the gaps in the patterned mask to singulate the integrated circuits.

Thus, methods of dicing semiconductor wafers, each wafer having a plurality of integrated circuits, have been disclosed. In accordance with an embodiment of the present invention, a method includes dicing a semiconductor wafer having a plurality of integrated circuits includes forming a mask above the semiconductor wafer, the mask composed of a layer covering and protecting the integrated circuits. The method also includes patterning the mask with a femtosecond-based laser scribing process to provide a patterned mask with gaps, exposing regions of the semiconductor wafer between the integrated circuits. The method also includes etching the semiconductor wafer through the gaps in the patterned mask to singulate the integrated circuits. In one embodiment, patterning the mask with the femtosecond-based laser scribing process includes forming trenches in the regions of the semiconductor wafer between the integrated circuits. In that embodiment, etching the semiconductor wafer includes etching the trenches formed with the laser scribing process.

What is claimed is:

1. A system for dicing a semiconductor wafer comprising a plurality of integrated circuits, the system comprising:
   a plasma etch chamber;
   a robotic transfer chamber coupled to the plasma etch chamber;
   a load lock;
   a laser scribe apparatus; and
   a factory interface coupled to the robotic transfer chamber by the load lock, and the factory interface coupled to the laser scribe apparatus, wherein the factory interface comprises a robot with an arm or a blade, wherein a semiconductor wafer is transferred from the laser scribe apparatus to the robot of the factory interface, from the robot of the factory interface to the robotic transfer chamber through the load lock, and from the robotic transfer chamber to the plasma chamber.

2. The system of claim 1, wherein the laser scribe apparatus is configured to perform laser ablation of streets between integrated circuits of the semiconductor wafer, and wherein the plasma etch chamber is configured to etch the semiconductor wafer to singulate the integrated circuits subsequent to the laser ablation.

3. The system of claim 2, further comprising:
a wet/dry station coupled to the robotic transfer chamber, the wet/dry station configured to clean the semiconductor wafer subsequent to the laser ablation or the etching.

4. The system of claim 1, further comprising:
a deposition chamber coupled to the robotic transfer chamber, the deposition chamber configured to form a mask layer above the integrated circuits of the semiconductor wafer.

5. The system of claim 4, wherein the deposition chamber is configured to deposit a polymer layer.

6. The system of claim 1, wherein plasma etch chamber is configured to generate a high density plasma.

7. The system of claim 1, further comprising a metrology station.

8. The system of claim 1, wherein the overall footprint of the system is approximately 3500 mm by 3800 mm.

9. The system of claim 1, wherein the laser scribe apparatus comprises a femtosecond-based laser.

10. The system of claim 9, wherein the femtosecond-based laser has a wavelength of approximately less than or equal to 530 nanometers with a laser pulse width of approximately less than or equal to 400 femtoseconds.

* * * * *